(12) United States Patent
Shih

(10) Patent No.: US 8,236,464 B1
(45) Date of Patent: Aug. 7, 2012

(54) METHOD FOR FABRICATING A MASK

(75) Inventor: Tah-Te Shih, Taipei (TW)

(73) Assignee: Inotera Memories, Inc., Hwa-Ya Technology Park Kueishan, Taoyuan (TW)

( * ) Notice: Subject to any disclaimer, the term of this patent is extended or adjusted under 35 U.S.C. 154(b) by 14 days.

(21) Appl. No.: 13/071,443

(22) Filed: Mar. 24, 2011

(30) Foreign Application Priority Data

Jan. 13, 2011 (TW) .................................. 100101217

(51) Int. Cl.
*G03F 1/20* (2012.01)
(52) U.S. Cl. ............... 430/5; 430/22; 430/296; 430/942
(58) Field of Classification Search ................ 430/5, 22, 430/296, 942
See application file for complete search history.

(56) References Cited

U.S. PATENT DOCUMENTS

| 7,604,903 | B1 | 10/2009 | Singh |
| 2008/0299467 | A1 | 12/2008 | Kim |

FOREIGN PATENT DOCUMENTS

TW 571343 1/2004

*Primary Examiner* — Christopher Young
(74) *Attorney, Agent, or Firm* — Winston Hsu; Scott Margo

(57) ABSTRACT

A method for making a mask, in which, an imprinting lithography process is employed to form a pattern in a first region of a mask substrate, and an E-beam writing process is employed to form another pattern in a second region of the mask substrate. Furthermore, these two patterns may be well stitched through an optical alignment process in an E-beam writing chamber.

10 Claims, 7 Drawing Sheets

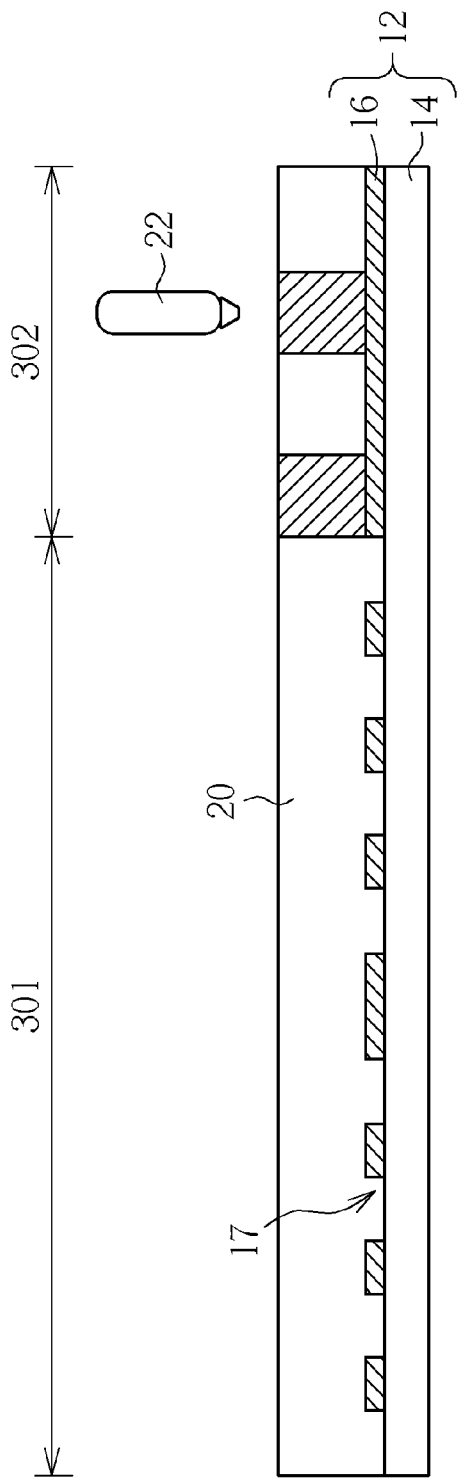
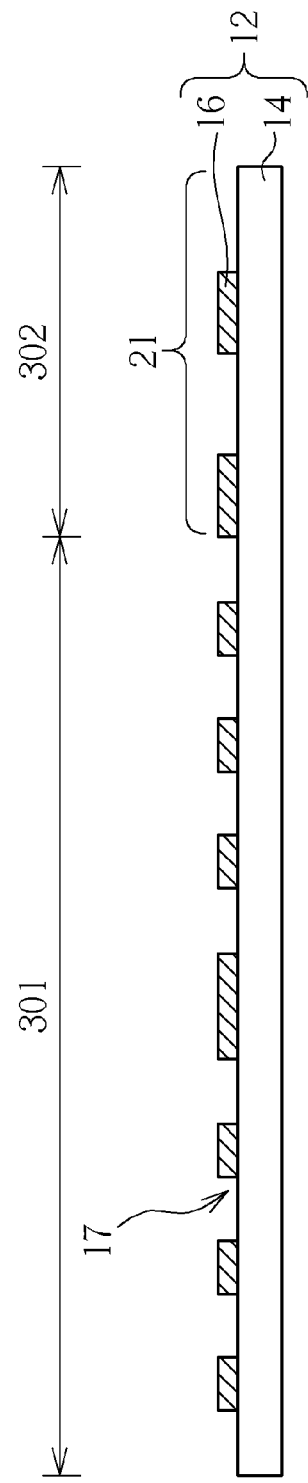
FIG. 6
FIG. 7

METHOD FOR FABRICATING A MASK

BACKGROUND OF THE INVENTION

1. Field of the Invention

The present invention relates to a fabricating method, and particularly a method for fabricating a mask.

2. Description of the Prior Art

Masks are required elements in, for example, semiconductor manufacturing processes. Conventionally, a mask is obtained through writing on a mask substrate utilizing an E-beam (electron beam) or laser tool. Recently, it usually needs 20 to 50 hours of writing to complete a mask, since the auxiliary patterns for OPC (optical proximity correction) are getting complicated and the design data or fracture mask data amount is getting huge. Furthermore, the yield to produce a mask is often low. The yield of production usually depends on the control of sensibility to defect, writing mistake, critical size, development after exposure defect, and registration accuracy.

Therefore, there is still a need for a novel method for fabricating a mask to achieve fast cycle time and improved yield performance.

One of the possible technologies is "imprint lithography". The technology has been reported and available for ten years and is mainly utilized to form patterns of sub-50 nm feature sizes on a single layer of material on wafers.

SUMMARY OF THE INVENTION

An objective of the present invention is to provide a method for fabricating a mask to fabricate masks further efficiently and with an improved yield.

In one aspect of the present invention with imprinting technology, the method for fabricating a mask according to the present invention comprises steps as follows. A master template (may also referred to as "master mold") is formed. The master template includes a first pattern. A mask substrate is provided. The mask substrate includes a light transparent substrate and a light-shielding material layer on the light transparent substrate, such as photo resist material. The mask substrate includes a first region and a second region. A first resist layer is formed on the light-shielding material layer of the mask substrate. The first resist layer in the first region is imprinted with the master template to transfer the first pattern to the first resist layer to form a second pattern, a replica of the first pattern. The light-shielding material layer is etched through the first resist layer to form a third pattern. The first resist layer is removed. A second resist layer is applied on the mask substrate. A writing process is performed on the second resist layer in the second region of the mask substrate using an E-beam. The second resist layer is developed, and the mask substrate is etched to form a fourth pattern on the light-shielding material layer in the second region. The second resist layer is removed.

In another aspect of the present invention, the method for fabricating a mask according to the present invention comprises steps as follows. A master template (may also referred to as "master mold") is formed. The master template includes a first pattern. A mask substrate is provided. The mask substrate includes a light transparent substrate and a light-shielding material layer on the light transparent substrate. The mask substrate includes a memory cell array region and a peripheral logic region. A first photo resist layer is formed on the light-shielding material layer of the mask substrate. The first photo resist layer in the memory cell array region is imprinted with the master template to transfer the first pattern to the first photo resist layer to form a second pattern. The light-shielding material layer is etched through the first photo resist layer to form a third pattern. The first photo resist layer is removed. A second photo resist layer is formed on the mask substrate. An E-beam writing process is performed on the second photo resist layer in the peripheral logic region of the mask substrate using an E-beam. The second photo resist layer is developed. The mask substrate is etched to form a fourth pattern on the light-shielding material layer in the peripheral logic region. The second photo resist layer is removed.

In the method for fabricating a mask according to the present invention, an imprinting process is performed on one region and an E-beam writing process is performed on another region to form the integral patterns of the mask. Accordingly, the master template utilized in the imprinting process may be repeatedly used to fabricate a plurality of masks each having a region to have a same pattern. While, with respect to the patterns in the regions of the masks which are non-repetitive or low-repetitive among the masks, they are formed using an electron writing process. In such a way, the masks having the patterns can be formed fast and economically, in comparison with conventional processes to form the masks entirely by electron writing and development.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3 to 8 are schematic cross-sectional views illustrating a method for fabricating a mask according to another embodiment of the present invention.

DETAILED DESCRIPTION

Figure 1:
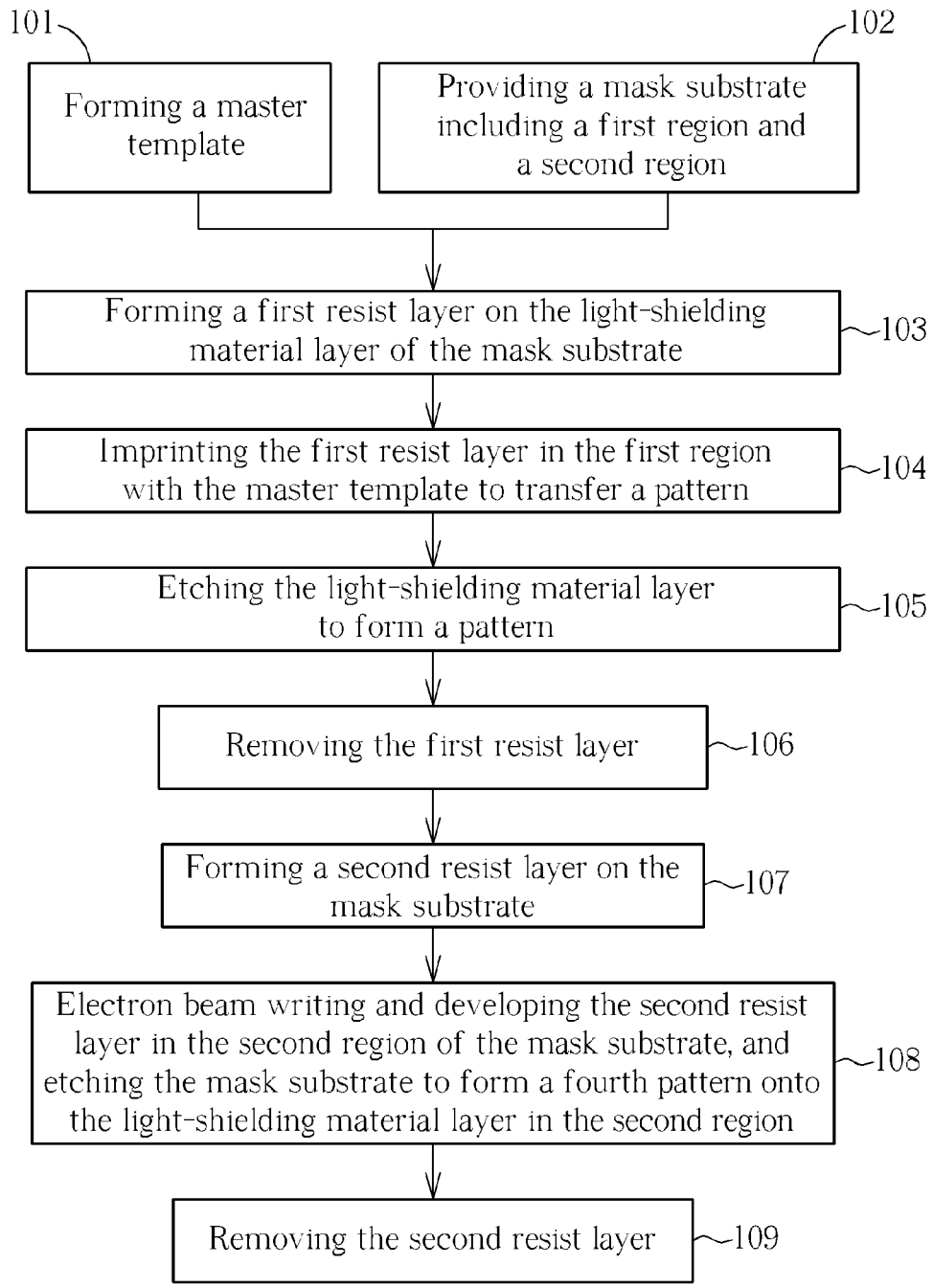
FIG. 1 is a flow chart illustrating a method for fabricating a mask according to an embodiment of the present invention.

FIG. 1 is a flow chart illustrating a method for fabricating a mask according to an embodiment of the present invention. The method includes steps as follows. Step 101 is performed to form a master template for imprinting. The master template includes a first pattern. The master template is like a stamp. The pattern of the master template may be formed by E-beam writing onto a substrate, such as a quartz plate, a glass plate, or a silicon plate. Step 102 is performed to provide a mask substrate. Step 101 may be performed before, after or at the same time with Step 102. The mask substrate includes a light transparent substrate and a light-shielding material layer on the light transparent substrate. The mask substrate includes a first region and a second region. The first region may be for example a region which has a repetitive pattern among the different masks. The second region may be for example a region which has a non-repetitive or low-repetitive pattern among the different masks. Step 103 is performed to form a first resist layer on the light-shielding material layer of the mask substrate. The resist layer is used for preventing the underlying layer from being etched in the later etching process. The resist layer may include material which can be imprinted and may be photo resist material, but not limited thereto. The first resist layer may be formed on only the first region or both the first region and the second region. Step 104 is performed to imprint the first resist layer in the first region with the master template to transfer the first pattern to the first resist layer to form a second pattern. After the second pattern is formed, the first resist layer may be cured as desired or required, depending on the properties thereof and then the master template is removed. Alternatively, the mask substrate may be removed and then the first resist layer is cured. The material used in a conventional imprint lithography process may be utilized in the present invention. Step 105 is performed to etch the light-shielding material layer through the first resist layer to form a third pattern. Step 106 is performed to remove the first resist layer. Step 107 is performed to form a second resist layer on the mask substrate. The second resist layer may be formed on only the second region or both the first and the second regions. Thereafter, Step 108 is carried out to perform an E-beam writing process on the second resist layer in the second region of the mask substrate using an E-beam, then, the second resist layer is developed to form the pattern, and the mask substrate is etched to form a fourth pattern on the light-shielding material layer in the second region. Thereafter, Step 109 is performed to remove the remained second resist layer. Before the E-beam writing process is carried out, an alignment may be performed if it is desired. Alignment marks may be formed through imprinting onto the first resist layer using the master template, curing of the first resist layer and etching, and it may be formed at the same time with the formation of the third pattern.

FIG. 1 shows an embodiment in which Steps 103, 104, 105 and 106 are performed for forming the third pattern in the first region in advance, and thereafter Steps 107, 108 and 109 are performed to form the fourth pattern in the second region; while, the method according to the present invention is not limited to this order. For example, in another embodiment, Steps 107, 108 and 109 may be performed to form the fourth pattern in the second region in advance, and thereafter Steps 103, 104, 105 and 106 are performed to form the third pattern in the first region. Alternatively, Step 106 of removing the first resist layer and Step 109 of removing the second resist layer may be performed separately or simultaneously after the third and the fourth patterns are formed.

Figure 2:
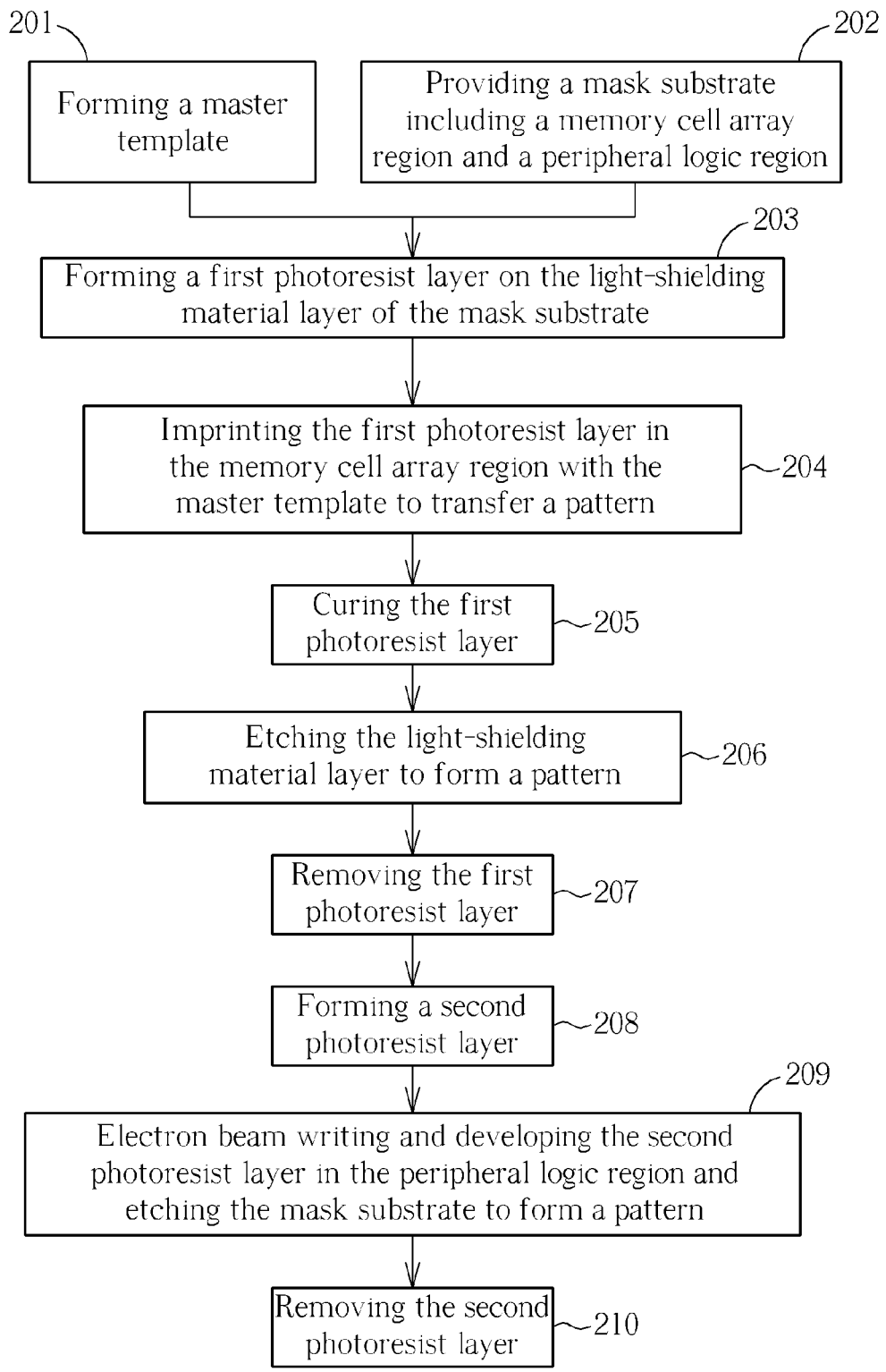
FIG. 2 is a flow chart illustrating a method for fabricating a mask according to another embodiment of the present invention.
Figure 3:
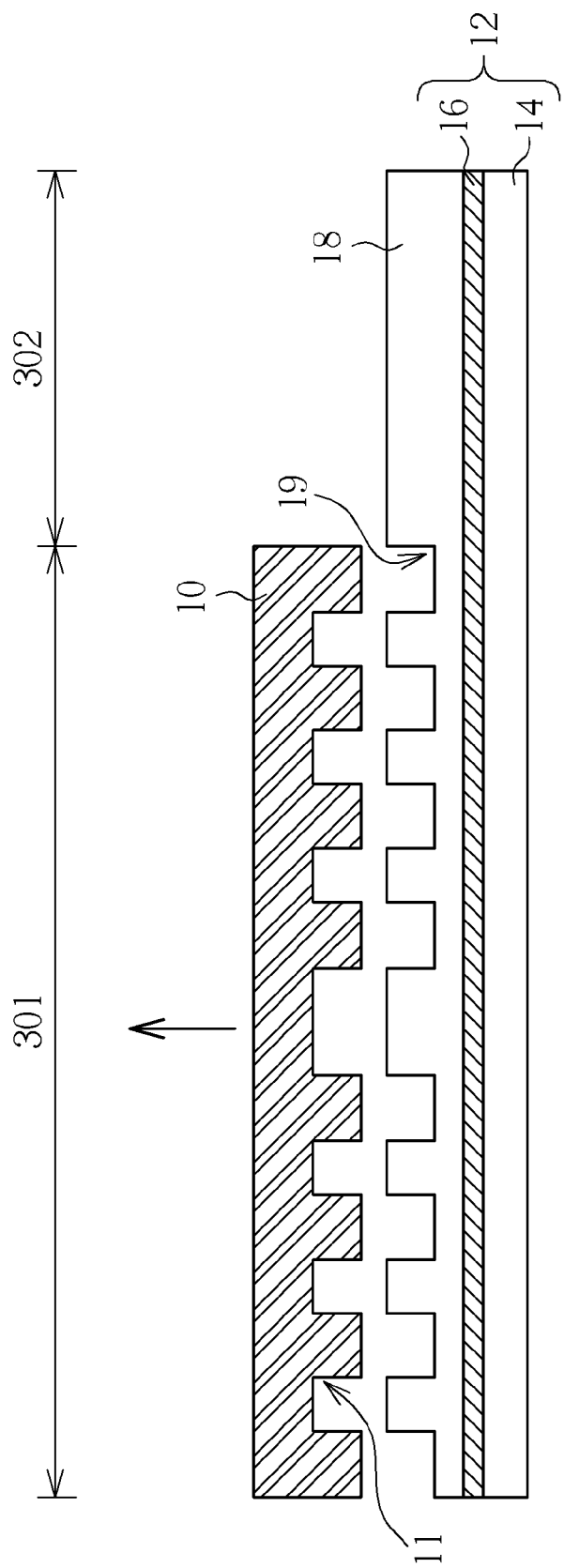

The method according to the present invention may be applied to the fabrication of the masks required in the memory device fabrication, that is, the first region may be a memory cell array region, and the second region may be a peripheral logic region. FIG. 2 is a flow chart illustrating a method for fabricating a mask according to another embodiment of the present invention. FIGS. 3 to 8 are schematic cross-sectional views illustrating the fabrication process. First, referring to FIGS. 2 and 3, Step 201 is performed to form a master template 10. The size of the master template 10 may be about the size of an entire memory cell array region. The master template 10 includes a first pattern 11, depending on the design or as desired, which is to be transferred onto the mask. Step 202 is performed to provide a mask substrate 12. The mask substrate 12 may include a light transparent substrate 14 and a light-shielding material layer 16 on the light transparent substrate 14. The mask substrate 12 may include a memory cell array region 301 and a peripheral logic region 302. The light transparent substrate 14 may be for example quartz, glass, and the like. The light-shielding material layer 16 may be for example a conventional chrome film. Step 201 may be performed before, after or at the same time with Step 202. Thereafter, Step 203 is performed to form a first photo resist layer 18 on the light-shielding material layer 16 of the mask substrate 12. The first photo resist layer 18 may include for example curable material, such as light-curable or heat-curable material, which is imprintable. The light-curable photo resist material may be for example a conventional photo resist material. The heat-curable photo resist material may be for example heat-curable polymer.

Thereafter, Step 204 is performed to imprint the first photo resist layer 18 in the memory cell array region 301 with the master template 10 to transfer the first pattern 11 to the first photo resist layer 18 to form a second pattern 19. Since the second pattern 19 is formed by imprinting, it is much faster than E-beam writing. Thereafter, Step 205 is optionally performed to cure the first photo resist layer 18. The curing may be achieved by heat or light. The curing may be carried out when the master template 10 still presses on the first photo resist layer 18, and the master template 10 is removed after the curing. Alternatively, the curing may be carried out after the master template 10 removed from the first photo resist layer 18. The steps may depend on the properties of the first photo resist layer 18. The arrow direction in FIG. 3 indicates the direction for removing the master template 10.

Figure 4:
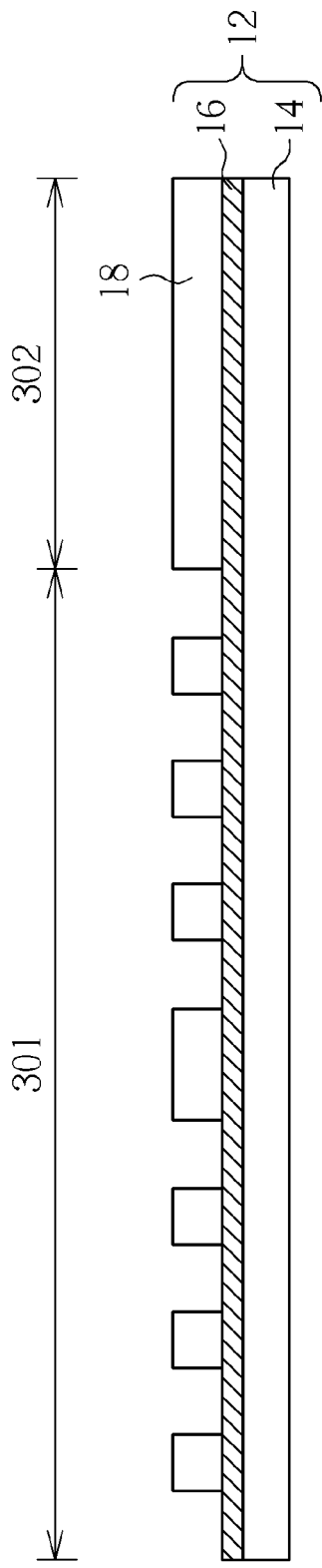
Figure 5:
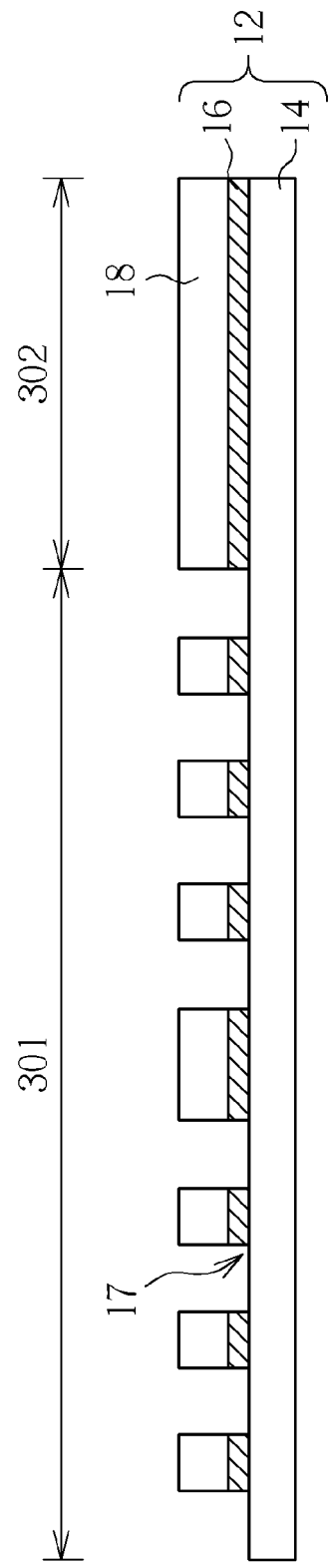

Thereafter, Step 206 is performed to etch the light-shielding material layer 16 in the memory cell array region 301 through the first photo resist layer 18 having the second pattern 19 to form a third pattern. The etching may include for example anisotropic etching. Because the first photo resist layer 18 includes recessed and raised portions after the imprinting, the thickness of the photo resist layer in a recessed portion is relatively thin, and the thickness of the photo resist layer in a raised portion is relatively thick. After etching, the light-shielding material layer 16 beneath the recessed portion may be exposed more quickly than the light-shielding material layer 16 beneath the raised portion, as shown in FIG. 4. The etching is continued to remove the exposed light-shielding material layer 16, so as to form a third pattern 17, as shown in FIG. 5. Accordingly, the etching may be a one-stage, two-stage or more-stage etching process. It may depend on the desired selectivity of the etching process to the first photo resist layer 18 and the light-shielding material layer 16.

Thereafter, Step 207 is performed to remove the remained first photo resist layer 18. It may be achieved by carrying out for example a wet or dry stripping process. Thereafter, Step 208 is performed to form a second photo resist layer 20 on the mask substrate 12. Thereafter, Step 209 is carried out to perform an E-beam writing process on the second photo resist layer 20 in the peripheral logic region 302 of the mask substrate 12 using an E-beam 22, as shown in FIG. 6. After development of the second photo resist layer 20, the mask substrate 12 is etched to form a fourth pattern 21 on the light-shielding material layer 16 in the peripheral logic region 302. Step 210 is performed to remove the remained second photo resist layer, as shown in FIG. 7.

FIG. 2 shows an embodiment in which Steps 203, 204, 205, 206 and 207 are performed for forming the third pattern 17 in the memory cell array region in advance, and thereafter Steps 208, 209 and 210 are performed to form the fourth pattern 21 in the peripheral logic region 302. Alternatively, in another embodiment, Steps 208, 209 and 210 may be performed to form the fourth pattern 21 in the peripheral logic region 302 in advance, and thereafter 203, 204, 205, 206, and 207 are performed to form the third pattern 17 in the memory cell array region. Alternatively, Step 207 of removing the first resist layer and Step 210 of removing the second resist layer may be performed respectively or at the same time after the third pattern 17 and the fourth pattern 21 are formed.

Figure 8:
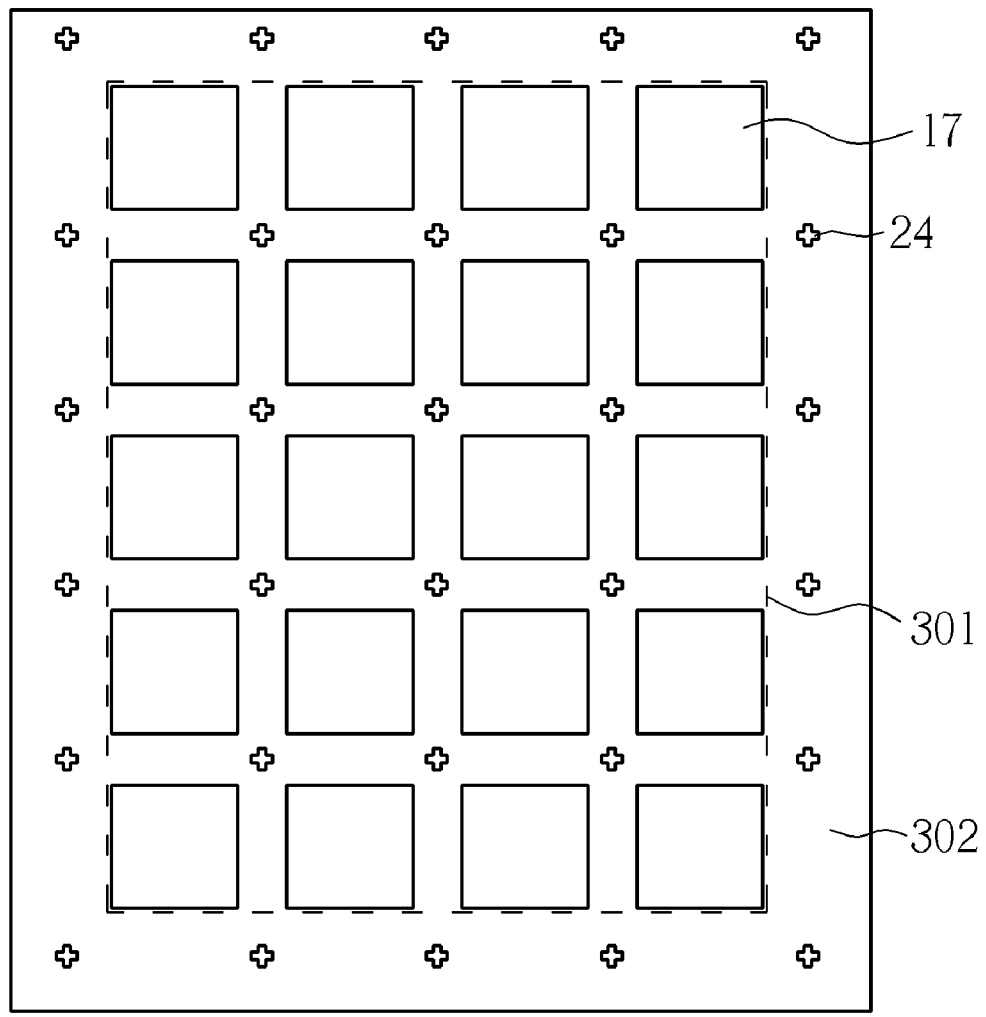

With respect to the aforesaid E-beam writing process, if the mask substrate 12 having the pattern of memory cell array region is moved into a writing chamber, it is preferably to carry out an alignment process before the E-beam writing process is carried out. Alignment marks 24 may be provided on the mask substrate 12, as shown in FIG. 8. The alignment marks 24 are preferably uniformly distributed at locations not interfering with the third pattern 17 and the fourth pattern 21, for example, between two adjacent third patterns 17. The alignment marks 24 may be formed in the same way and at the same time with the formation of the third pattern 17.

Figure 9:
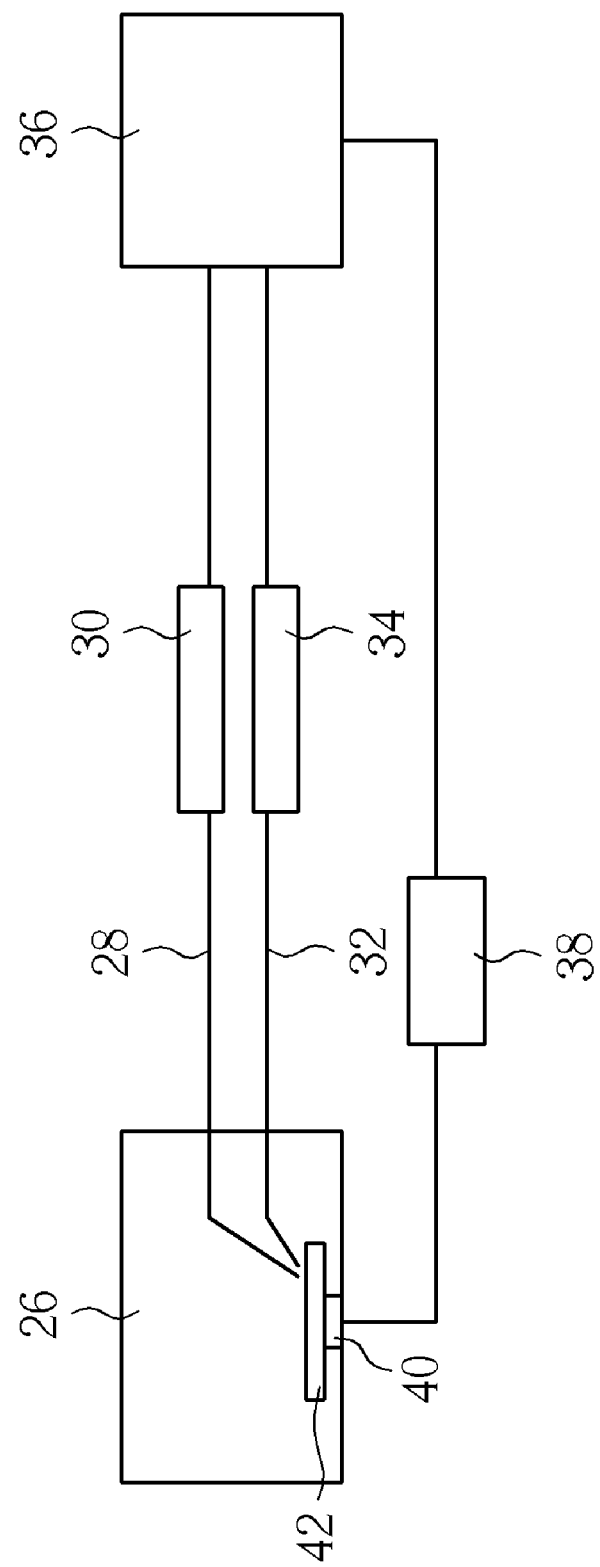
FIG. 9 is a schematic diagram illustrating a combination of an E-beam writing chamber and an optical alignment mechanism in the method for fabricating a mask according to an embodiment of the present invention.

FIG. 9 illustrates a combination of an E-beam writing chamber and an optical alignment mechanism in the method for fabricating a mask according to an embodiment of the present invention. For a typical writing chamber which may need to be kept in a vacuum status during a process, the writing chamber in a conventional technology is not able to be equipped with an alignment device. In the present invention, the writing chamber is able to be combined with an optical alignment mechanism and the vacuum status is not affected. A first light conductive element 28, such as optical fiber, is disposed in the writing chamber 26. The first light conductive element 28 is allowed to extend to outside the writing chamber 26 to connect with a light detecting device 30. The light detecting device 30 may be for example a charge-coupled device (CCD) or complementary metal-oxide-semiconductor (CMOS) image sensor element. A second light conductive element 32, such as optical fiber, is disposed in the writing chamber 26 and allowed to extend to outside the writing chamber 26 to connect with a light source 34. The light source 34 may be for example a laser or a light-emitting diode (LED). The light from the light source 34 is transmitted through the second light conductive element 32 and incident on the mask substrate 12 to produce a reflective light. The reflective light is transmitted through the first light conductive element 28 to the light detecting device 30. Therefore, the mask substrate 12 may be able to be orientated to a proper position for E-beam writing through detecting the alignment marks 24. For example, a signal or signals are transferred from the light detecting device 30 to a computer process unit 36 for a computing process. A power unit 38 disposed outside the chamber 26 receives a signal or signals from the computer process unit 36 and correspondingly enables a power transmission unit 40 to move a stage 42 to an aligned location. In such a way, an alignment is well achieved to allow the combination of the third pattern 17 of the light-shielding material layer 16 with the fourth pattern 21.

The method according to the present invention is particularly suitable for fabricate a plurality of different masks including both of a region having a same pattern (such as memory cell array region) and another region having a different pattern (such as peripheral logic region). Specifically, different memory devices each having a memory cell array region which may have the same pattern among the memory devices and the pattern is relatively complicated, and accordingly it is convenient and fast to form this type of pattern by imprinting. The master plate made in accordance with this pattern can be repeatedly utilized to imprint such kind of regions of different masks. The circuit pattern of the peripheral logic region is usually simpler and with a lower density, and the design for the circuit pattern is more frequently changed. Accordingly, it is more convenient to form the pattern by E-beam writing. The patterns obtained from these two formation stages is able to be precisely combined (or may referred to as "stitched") in the E-beam writing chamber in virtue of the optical alignment system equipped therewith.

Those skilled in the art will readily observe that numerous modifications and alterations of the device and method may be made while retaining the teachings of the invention.

What is claimed is:

1. A method for fabricating a mask, comprising:
forming a master template comprising a first pattern;
providing a mask substrate comprising a light transparent substrate and a light-shielding material layer on the light transparent substrate, the mask substrate comprising a first region and a second region;
forming a first resist layer on the light-shielding material layer of the mask substrate;
imprinting the first resist layer in the first region with the master template to transfer the first pattern onto the first resist layer to form a second pattern;
etching the light-shielding material layer through the first resist layer to form a third pattern;
removing the first resist layer;
forming a second resist layer on the mask substrate;
performing an electron beam writing process on the second resist layer in the second region of the mask substrate using an electron beam, developing the second resist layer, and etching the mask substrate to form a fourth pattern onto the light-shielding material layer in the second region; and
removing the second resist layer.

2. The method according to claim 1, wherein, after imprinting the first resist layer using the master template, the master template is removed from the first resist layer after the first resist layer is cured.

3. The method according to claim 1, further comprising performing an alignment process, wherein, the electron beam writing process is carried out in a writing chamber, and the alignment process comprises:
providing a plurality of alignment marks on the mask substrate;
disposing a first light conductive element in the writing chamber and allowing the first light conductive element to extend to outside the writing chamber to connect with a light detecting device;
disposing a second light conductive element in the writing chamber and allowing the second light conductive element to extend to outside the writing chamber to connect with a light source;
allowing the light from the light source to be transmitted through the second light conductive element and incident on the mask substrate to produce a reflective light to be transmitted through the first light conductive element to the light detecting device, thereby to detect the alignment marks to orientate the mask substrate.

4. The method according to claim 3, wherein the alignment marks are formed simultaneously with the formation of the third pattern using a process as same as the process for forming the third pattern.

5. A method for fabricating a mask, comprising:
forming a master template comprising a first pattern;
providing a mask substrate comprising a light transparent substrate and a light-shielding material layer on the light transparent substrate, the mask substrate comprising a memory cell array region and a peripheral logic region;
forming a first photo resist layer on the light-shielding material layer of the mask substrate;
imprinting the first photo resist layer in the memory cell array region with the master template to transfer the first pattern onto the first photo resist layer to form a second pattern;
etching the light-shielding material layer through the first photo resist layer to form a third pattern;
removing the first photo resist layer;
forming a second photo resist layer on the mask substrate;

performing an electron beam writing process on the second photo resist layer in the peripheral logic region of the mask substrate using an electron beam, developing the second photo resist layer, and etching the mask substrate to form a fourth pattern onto the light-shielding material layer in the peripheral logic region; and removing the second photo resist layer.

6. The method according to claim 5, further comprising performing an alignment process, wherein, the electron beam writing process is carried out in a writing chamber, and the alignment process comprises:

providing a plurality of alignment marks on the mask substrate;

disposing a first light conductive element in the writing chamber and allowing the first light conductive element to extend to outside the writing chamber to connect with a light detecting device;

disposing a second light conductive element in the writing chamber and allowing the second light conductive element to extend to outside the writing chamber to connect with a light source; and allowing the light from the light source to be transmitted through the second light conductive element and incident on the mask substrate to produce a reflective light to be transmitted through the first light conductive element to the light detecting device, thereby to detect the alignment marks to orientate the mask substrate.

7. The method according to claim 6, wherein the alignment marks are formed simultaneously with the formation of the third pattern using a process as same as the process for forming the third pattern.

8. The method according to claim 6, wherein, each of the first light guide element and the second light guide element comprises an optical fiber.

9. The method according to claim 5, wherein, after imprinting the first photo resist layer using the master template, the master template is removed from the first photo resist layer, and thereafter the first photo resist layer is cured.

10. The method according to claim 5, wherein, after imprinting the first photo resist layer using the master template, the master template is removed from the first photo resist layer after the first photo resist layer is cured.

* * * * *